United States Patent [19]

Lipp

[11] B 3,984,587

[45] Oct. 5, 1976

[54] CHEMICAL VAPOR DEPOSITION OF LUMINESCENT FILMS

[75] Inventor: Steven Alan Lipp, Cranbury, N.J.

[73] Assignee: RCA Corporation, New York, N.Y.

[22] Filed: July 23, 1973

[21] Appl. No.: 381,709

[44] Published under the second Trial. Voluntary Protest Program on January 13, 1976 as document No. B 381,709.

[52] U.S. Cl. .................... 427/70; 252/301.4 F; 252/301.4 R; 252/301.6 F; 252/301.6 R; 313/467; 427/248; 427/255

[51] Int. Cl.$^2$............................................ B05D 5/12

[58] Field of Search .......... 117/33.5 E, 107, 106 R, 117/106 A; 260/429.2; 427/69, 255, 248, 70; 313/467; 423/326, 279, 593, 600; 252/301.4 F, 301.4 R, 301.6 F, 301.6 R

[56] References Cited

UNITED STATES PATENTS

| | | | |
|---|---|---|---|
| 3,018,194 | 1/1962 | Norman et al. | 117/107 |
| 3,113,040 | 12/1963 | Winston | 117/33.5 E |
| 3,178,308 | 4/1965 | Oxley et al. | 117/106 |
| 3,297,414 | 1/1967 | Mazdiyasni et al. | 23/345 |
| 3,356,527 | 12/1967 | Mashier et al. | 117/107.2 R |
| 3,356,703 | 12/1967 | Mazdiyasni et al. | 260/429.2 |
| 3,372,297 | 3/1968 | Pearsall et al. | 313/317 |
| 3,434,863 | 3/1969 | Hansen et al. | 117/33.5 E |
| 3,449,148 | 6/1969 | Shortes | 117/106 R |
| 3,485,666 | 12/1969 | Sterling | 117/106 R |
| 3,518,115 | 6/1970 | Pammer et al. | 117/106 R |
| 3,567,505 | 3/1971 | Harrington | 117/33.5 E |
| 3,594,216 | 7/1971 | Charles et al. | 117/107.2 R |
| 3,634,477 | 1/1972 | Chattoraj et al. | 117/107.2 R |
| 3,647,535 | 3/1972 | Naber | 117/106 R |
| 3,894,164 | 7/1975 | Dismukes et al. | 427/248 |

FOREIGN PATENTS OR APPLICATIONS

| | | | |
|---|---|---|---|
| 1,104,448 | 2/1968 | United Kingdom | 313/467 |
| 702,575 | 1/1954 | United Kingdom | 427/70 |

Primary Examiner—Harry J. Gwinnell
Attorney, Agent, or Firm—G. H Bruestle; L. Greenspan

[57] ABSTRACT

Method for depositing a luminescent film upon a substrate comprising vaporizing into a nonreactive carrier gas (1) at least one member of a first group consisting of hydrides and alkyls of $M^1$, wherein $M^1$ is at least one of silicon, germanium, boron, phosphorus, and aluminum, (2) at least one volatile $M^2$-containing organo-metallic compound of a second group, wherein $M^2$ is at least one of zinc, cadmium, magnesium, calcium, beryllium, strontium, or barium, and (3) at least one volatile $M^3$-containing organo-metallic compound of a third group, wherein $M^3$ is at least one activator for said luminescent film. The vapor-laden carrier gas and the oxidizing gas are contacted with the substrate which is at temperatures in the range of about 300° to 700°C. The reaction is continued unitl the desired thickness of luminescent film is achieved.

10 Claims, 3 Drawing Figures

CHEMICAL VAPOR DEPOSITION OF LUMINESCENT FILMS

BACKGROUND OF THE INVENTION

This invention relates to a chemical vapor deposition method for producing luminescent films by thermal decomposition of organo-metallic compounds.

Luminescent films are employed in viewing screens of various electronic devices, such as television picture tubes, oscillographs, cathode-ray display tubes, and image tubes. Such luminescent films have been made by evaporation and condensation of the luminescent material, or by thermal decomposition of inorganic compounds containing the constituents of the luminescent material at or in the vicinity of the substrate for the film. Also, in U.S. Pat. application Ser. No. 341,597 filed Mar. 15, 1973 now U.S. Pat. No. 3,894,164, by J. P. Dismukes et al, there is disclosed a method for making oxide and sulfide luminescent films from organo-metallic compounds. By the novel method disclosed herein, silicate, germanate, phosphate, borate and aluminate luminescent films can be made from organo-metallic compounds.

SUMMARY OF THE INVENTION

The novel method comprises first vaporizing into a nonreactive carrier gas at least one hydride and/or alkyl of silicon, germanium, boron, phosphorus, and/or aluminum; at least one organo-metallic compound containing zinc, cadmium, magnesium, calcium, beryllium, strontium, and/or barium; and at least one organo-metallic compound containing an activator for the desired luminescent film. The vapor-laden carrier gas and an oxidizing gas are contacted with the substrate which is at temperatures in the range of about 300° to 700°C. The reaction is continued until the desired luminescent-film thickness is deposited. The luminescent film may be annealed at temperatures above about 500°C to enhance the luminescent properties of the film. The use of alkyls and hydrides in conjunction with an oxidizing gas extends the range of phosphor composition to silicates etc. which could not be made by prior processes. When the novel method is practiced with a fluidized bed, a less expensive substrate may be used.

DETAILED DESCRIPTION OF THE INVENTION

Figure 3:
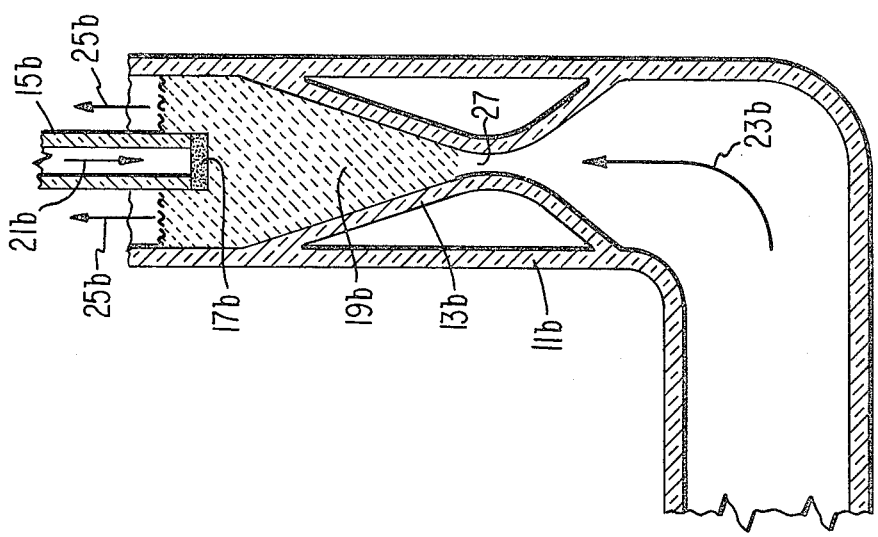
FIG. 3 is a sectional view of another apparatus similar to that shown in FIG. 1.

The novel method involves passing to a heated substrate, which may be an extended surface or may be particles in a fluidized bed, an oxidizing gas, and a combination of gases and/or vapors containing the cations of the desired phosphors. The oxidizing gas may be water vapor, or oxygen, or combinations thereof, or may be another gas which is oxidizing at the reaction temperature. The oxidizing gas may be mixed with a diluent gas. The cation-containing gases and vapors are picked up and carried in a nonreactive carrier gas such as nitrogen, argon, helium, neon or mixtures thereof. The substrate is nonreactive with the various gases and vapors that are present and with the phosphors that are produced. Also, the substrate should have a softening temperature above the temperature of the reaction. Some suitable substrates are of silica, high silica glass, alumina, and zirconium silicate.

The phosphors that can be made by the novel method are of the general class $$M^1_a M^2_b O_c : dM^3$$

where $M^1$ is one or more bivalent cations such as $Zn^{+2}$, $Cd^{+2}$, $Be^{+2}$, $Ca^{+2}$, $Sr^{+2}$, $Ba^{+2}$ and $Mg^{+2}$, $M^2$ is one or more polyvalent cations, such as $Si^{+4}$, $Ge^{+4}$, $B^{+3}$, $P^{+3}$, and $Al^{+3}$, $M^3$ is an activator cation for the phosphor and may be one or more cations of Mn, Ce, Eu, Tb, Ti, Sb, Sm, Cr, Sn, and As, $a$, $b$, and $c$ are values in moles normally used to provide the necessary stoichiometry for the desired host crystal for the phosphor, and $d$ is an activator proportion generally in the range of 0.001 to 0.1 mole per mole host crystal. Some typical phosphor compositions that can be made by the novel method are $Zn_2GeO_4$:Mn, $Zn_2SiO_4$:Mn, $Zn_2SiO_4$:Mn:As, $Zn_9BeSnSi_6O_{24}$:Mn, $(BaMg)_2SiO_4$:Pb, $CdB_2O_4$:Sn, $(Mg,Cd,Zn)_{Cd,Zn)2}SiO_4$:Mn, and $CdAl_2O_4$:Mn.

The cations for the desired phosphor are introduced as materials which are gases or volatile liquids or solids at room temperature. The polyvalent cations $M^2$ may be introduced as hydrides or alkyls such as $SiH_4$, $Ge(CH_3)_4$, $B(CH_3)_3$, and $Al(C_2H_5)_3$. The divalent cations $M^1$ may be introduced as alkyls such as $Zn(C_2H_5)_2$ and $Cd(CH_3)_2$ or as beta-diketonates, such as $Ca(thd)_2$, $Cd(acac)_2$, and $Sr(thd)_2$, where $thd$ is tetramethylheptanedionate and $acac$ is acetylacetonate. The activator cations may be introduced as volatile or gaseous organo-metallic materials such as tetraisopropyl titanate, and methyl cyclopentadiene manganese tricarbonyl.

The novel method is particularly useful for producing oxygen-dominated phosphors on the surfaces of particles that are agitated, as in a fluidized bed. This may be accomplished by transporting the required reactants in a stream of carrier gas. Each of the transported materials enters the fluidized bed unreacted and is there contacted with the oxidizing gas. The particles of the fluidized bed afford a surface on which the reaction can occur and upon which the nonvolatile reaction product may deposit. One advantage of coating particles is that it is not necessary to provide relatively expensive transparent substrates that can stand high temperatures.

The novel method may be practiced with the apparatus and by the general procedure disclosed in the above-cited application of Dismukes et al. However, in that process, where a fluidized bed is used, the oxidizing gas is mixed with the cation-containing gases before being introduced into the bed. It has been found that when the novel method is practiced in this way, a substantial proportion of the phosphor is formed as loose powder rather than as a film on the particles. For practicing the novel method, it is preferred to introduce the oxidizing gas directly into the fluidized bed separate from the cation-containing gases. To this end, it is preferred to employ one of the equipments shown in FIGS. 1, 2 and 3 herein.

Figure 1:
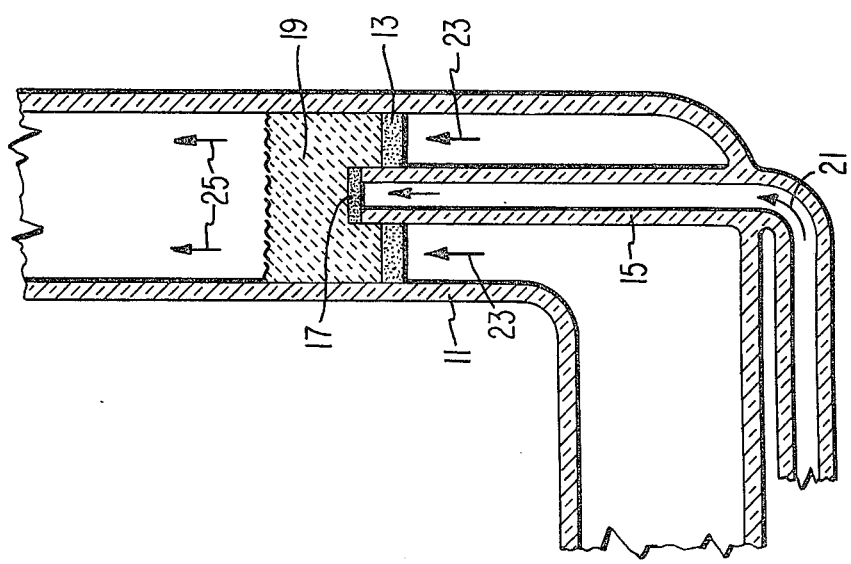
FIG. 1 is a sectional view of a portion of an apparatus in which the novel method may be practiced for producing luminescent films on particles in a fluidized bed.

FIG. 1 shows an outer quartz glass tube 11 having a porous support 13 of fritted quartz across the entire inside cross section of the tube 11. An inner quartz glass tube 15 passes through the wall of the outer tube 11 and through the support 13 near the center thereof. A porous plug 17 of fritted quartz closes the end of the inner tube 15.

A bed of nonreactive substrate particles rests on the support 13 and the plug 17. Oxidizing gas passes into the bed 19 through the inner tube 15 and the plug 17 as shown by the arrow 21. Cation-containing gases and vapors in a carrier gas pass into the bed 19 through the outer tube 11 and support 13 as shown by the arrows 23. Exhaust gases leave the bed 19 as shown by the arrow 25.

Figure 2:
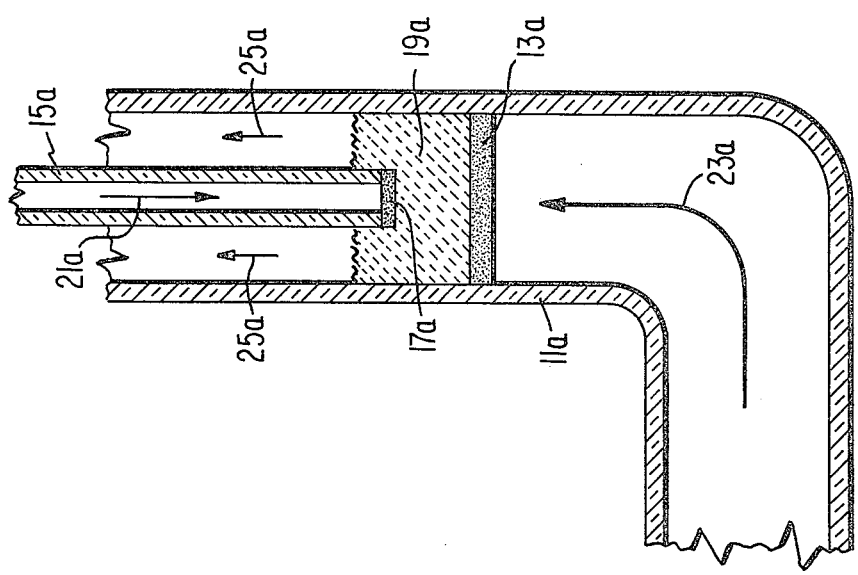
FIG. 2 is a sectional view of an apparatus similar to that shown in FIG. 1.

The apparatus of FIG. 2 is similar to that of FIG. 1 except that the inner tube 15, instead of passing through the support 13 into the bottom of the bed 19, passes into the top of the bed 19a to a desired depth. The apparatus of FIG. 3 is similar to that of FIG. 2 except that the porous support 13a is replaced with a flared wall 13b having a central capillary 27 about 1.0 millimeter in diameter. The cation-containing gases pass through the capillary 27 into the bed 19b.

Not shown in the figures are zones which are used to volatilize a desired concentration of cation-containing material into the carrier gases. When one or more of the reactants are solids or liquids, at least two heating zones are needed. One zone is used to heat the bed to the required temperature for reaction, and additional zones are needed to preheat the cation-containing materials to volatilize them so that they can be transported in the carrier gas. Compounds that are liquids of sufficient volatility at room temperature can be transported by bubbling a carrier gas through the liquid. The transport rates for the gaseous compounds, for example the hydrides, and the liquids can be controlled by adjusting the respective flow rates. The transport rate for vapors from solids and liquids can be controlled by adjusting both the carrier flow rate and the temperature at which the volatilization takes place.

The particles to be coated should be of the appropriate size for good fluidization. The preferred size range for the particles is about 20 to 80 microns average size. The particles on which the phosphor is deposited can be nonluminescent, or may be a phosphor core, in which case an onionskin phosphor can be produced. Many of the phosphors made by the novel method require post-growth heating in order to optimize the luminescence. It is preferred that the core on which the phosphor layer is deposited by the novel method be capable of withstanding processing up to about 1100°C without degradation.

Good fluidization is very important for maintaining bed homogeneity by circulating the particles. In doing so all particle surfaces are equally exposed to the reactive gases and are uniformly coated. The gas flow required for good fluidization depends on bed size (height and width), size and shape of the particles in the bed, density of the particles, temperature of the bed, and pressure above the bed. Most of the work has been done on two types of bed particles, irregular-shaped $Zn_2SiO_4$:Mn (20 – 80 $\mu$) and smooth spherical dissociated $ZrSiO_4$ (30 – 120 $\mu$). Bed charges varied from 30 to 150 g and reaction temperatures varied from 300° – 700°C. The gas flow rates were determined by several parameters. A minimum gas flow through the bed is always required for fluidization. Increasing the flow beyond that rate can increase transport rate and, consequently, deposition rate. The flow of oxidizing gas is maintained in excess so as to make the bed particles able to form a suitable oxidizing substrate for the reactive gases to contact.

EXAMPLE

The following is an example for depositing layers of manganese-activated zinc silicate phosphor on particles of dissociated zirconium silicate $ZrSiO_4$ using the apparatus shown in FIG. 1. A fluidized bed 32 mm I.D. is used for the reaction. A charge of 50 g. of dissociated $ZrSiO_4$ spheres (44 – 74 $\mu$) (marketed by Ionarc Corp., Concord, N.H.) to be used as the core material is added to form the bed. The source of Zn was zinc diethyl $Zn(C_2H_5)_2$ (marketed by Ventron Corporation, Beverly, Mass.), a volatile liquid; the source of manganese was methyl cyclopentadiene manganese tricarbonyl (marketed by PCR, Incorp., Gainesville, Fla.), a volatile liquid; and the source of Si was silicon hydride $SiH_4$ (marketed by Scientific Gas Products, Edison, N.J.), a gas at room temperature. Both liquid compounds were kept in bubblers and were transported in a nitrogen carrier gas flow. The $SiH_4$ was obtained as a 3% dilution in argon and was further mixed with the two carrier gas flows and an additional amount of nitrogen gas before entering the bed. This excess $N_2$ was adjusted to maintain good fluidization. Oxygen gas was added through a separate tube 15 so that the reaction would not occur outside the bed 19.

The tubing was first purged with nitrogen gas for one hour before conducting the method. The bed 19 was preheated to about 425°C with just a nitrogen flow of about 530 cc/min., fluidizing the bed, and an oxygen flow of about 43 cc/min. saturating the bed with oxygen. The $SiH_4$ flow of about 17 cc/min. (transporting about 47 mg/hr.), the nitrogen flow through the $Zn(C_2H_5)_2$ of about 25 cc/min. (transporting 266 mg/hr.) and the nitrogen flow through the manganese source of about 45 cc/min. (transporting about 2.9 mg/hr.) were then turned on in succession. The growth was continued for 5 hrs., at which time all the flows except the fluidizing $N_2$ were shut off. The bed temperature was raised to about 1000°C for about 1 hour. During this high-temperature heating, nitrogen, 120 cc/min. was passed through an $H_2O$ bubbler and into the bed through the inner tube 15.

The bed was then removed from the reaction tube. Under cathode-ray bombardment, the particles emitted uniform green luminescence. The intensity of the luminescence relative to the standard bulk phosphor ($Zn_2SiO_4$:Mn) decreased with increasing voltage. Scanning electron miscroscope pictures confirmed that a thin coating ($< 1\mu$) of $Zn_2SiO_4$:Mn was placed on the surface of the spheres which had made up the bed.

I claim:

1. A method for depositing a luminescent film upon a non-reactive substrate comprising
   a. vaporizing into a nonreactive carrier gas (1) at least one member of a first group consisting of hydrides and alkyls of $M^1$, wherein $M^1$ is at least one of silicon, germanium, boron, phosphorus and aluminum, (2) at least one volatile $M^2$-containing organo-metallic compound of a second group, wherein $M^2$ is at least one of zinc, cadmium, magnesium, calcium, beryllium, strontium, and barium, and (3) at least one volatile $M^3$-containing organo-metallic compound of a third group wherein $M^3$ is at least one activator for said film,
   b. heating said substrate to temperatures in the range of about 300° to 700°C, c. contacting the vapor-laden carrier gas and an oxidizing gas with said heated substrate, d. and continuing steps (a), (b) and (c) for a time interval sufficient to cause the substrate to be coated with a luminescent film consisting essentially of a phosphor having the formula $$M^1_a M^2_b O_c : dM^3$$

wherein $M^1$, $M^2$, and $M^3$ are as defined above, $a$, $b$ and $c$ are values in moles normally used to provide the desired host crystal for the phosphor and $d$ is an activator proportion generally in the range of 0.001 to 0.1 mole per mole host crystal.

2. The method defined in claim 1 wherein said member of said first group is silicon hydride.

3. The method defined in claim 2 wherein $M^1$ is silicon, $M^2$ is zinc and $M^3$ is manganese.

4. The method defined in claim 1 wherein said oxidizing gas is at least one of oxygen and water vapor.

5. The method defined in claim 1 including the subsequent step of annealing said luminescent film above 500°C and below the softening temperature of said substrate for a time interval sufficient to enhance the luminescence from said film.

6. A method for depositing luminescent films upon the surfaces of nonreactive particles comprising a. vaporizing into a nonreactive carrier gas (1) at least one member of a first group consisting of hydrides and alkyls of $M^1$, wherein $M^1$ is at least one of silicon, germanium, boron, phosphorus, and aluminum; (2) at least one volatile $M^2$-containing organo-metallic compound of a second group, wherein $M^2$ is at least one of zinc, cadmium, magnesium, calcium, beryllium, and barium; and (3) at least one volatile $M^3$-containing organo-metallic compound of a third group, wherein $M^3$ is at least one activator for said luminescent film, b. passing said vapor-laden carrier gas upward through a bed of said nonreactive particles, said particles being maintained at temperatures in the range of about 300° to 700°C, c. passing an oxidizing gas into said bed of nonreactive particles separately from said carrier gas, said oxidizing gas and said vapor-laden carrier gas mixing with one another in said bed, d. and continuing said method steps (a), (b) and (c) for a time interval sufficient to cause the substrate to be coated to a desired thickness with a luminescent film consisting essentially of a phosphor having the formula $$M^1_a M^2_b O_c : dM^3$$

wherein $M^1$, $M^2$, and $M^3$ are as defined above, $a$, $b$ and $c$ are values in moles normally used to provide the desired host crystal for the phosphor, and $d$ is an activator proportion generally in the range of 0.001 to 0.1 mole per mole host crystal.

7. The method defined in claim 6 wherein said $M^1$ is silicon, $M^2$ is zinc and $M^3$ is manganese.

8. The method defined in claim 7 wherein said member of said first group is silicon hydride.

9. The method defined in claim 8 wherein said nonreactive carrier gas is nitrogen.

10. The method defined in claim 8 wherein said member of said second group is zinc diethyl and said member of said third group is methyl cyclopentadiene manganese tricarbonyl.

* * * * *

UNITED STATES PATENT OFFICE
CERTIFICATE OF CORRECTION

PATENT NO. : 3,984,587
DATED : October 5, 1976
INVENTOR(S) : Steven Alan Lipp

It is certified that error appears in the above-identified patent and that said Letters Patent are hereby corrected as shown below:

Column 2, line 25    remove subscript "CdZn)"

Column 5, line 10    after "phosphor" add --,--

Signed and Sealed this

Twenty-eighth Day of December 1976

[SEAL]

Attest:

RUTH C. MASON
*Attesting Officer*

C. MARSHALL DANN
*Commissioner of Patents and Trademarks*